United States Patent
Kivekäs et al.

(10) Patent No.: US 7,031,687 B2
(45) Date of Patent: Apr. 18, 2006

(54) BALANCED CIRCUIT ARRANGEMENT AND METHOD FOR LINEARIZING SUCH AN ARRANGEMENT

(75) Inventors: Kalle Kivekäs, Espoo (FI); Aarno Pärssinen, Espoo (FI)

(73) Assignee: Nokia Corporation, Espoo (FI)

( * ) Notice: Subject to any disclaimer, the term of this patent is extended or adjusted under 35 U.S.C. 154(b) by 215 days.

(21) Appl. No.: 10/474,848

(22) PCT Filed: Apr. 18, 2001

(86) PCT No.: PCT/EP01/04414

§ 371 (c)(1),
(2), (4) Date: Oct. 15, 2003

(87) PCT Pub. No.: WO02/084859

PCT Pub. Date: Oct. 24, 2002

(65) Prior Publication Data

US 2004/0137870 A1    Jul. 15, 2004

(51) Int. Cl.
*H04B 1/26* (2006.01)
(52) U.S. Cl. ............... 455/313; 455/334; 455/333; 455/226.1; 327/358
(58) Field of Classification Search ........... 455/313, 455/323, 333, 326, 334, 317, 226.4, 67.11; 327/356, 357, 358, 359, 113, 355
See application file for complete search history.

(56) References Cited

U.S. PATENT DOCUMENTS

| 5,548,840 | A | * | 8/1996 | Heck | 455/326 |
| 5,584,066 | A | | 12/1996 | Okanobu | |
| 5,590,411 | A | | 12/1996 | Sroka et al. | |
| 5,855,449 | A | | 1/1999 | Thomas | |
| 6,078,802 | A | * | 6/2000 | Kobayashi | 455/326 |
| 6,140,849 | A | * | 10/2000 | Trask | 455/326 |
| 6,167,247 | A | * | 12/2000 | Kannell et al. | 455/317 |
| 6,230,001 | B1 | * | 5/2001 | Wyse | 327/357 |
| 6,393,260 | B1 | * | 5/2002 | Murtojarvi et al. | 455/333 |
| 6,411,801 | B1 | * | 6/2002 | Kim et al. | 455/333 |
| 6,590,439 | B1 | * | 7/2003 | Larson | 327/358 |
| 6,710,632 | B1 | * | 3/2004 | Tada | 327/108 |
| 6,711,396 | B1 | * | 3/2004 | Bergsma et al. | 455/317 |
| 6,759,904 | B1 | * | 7/2004 | Behzad | 327/359 |
| 6,892,062 | B1 | * | 5/2005 | Lee et al. | 455/333 |

FOREIGN PATENT DOCUMENTS

JP        11-122046      *  4/1999

OTHER PUBLICATIONS

Patent Abstracts of Japan, vol. 1999, No. 09, Jul. 30, 1999 & JP 11 122046 A (NEC Corp), Apr. 20, 1999.

* cited by examiner

*Primary Examiner*—Lana Le
(74) *Attorney, Agent, or Firm*—Squire, Sanders & Dempsey, L.L.P.

(57) ABSTRACT

The present invention relates to a balanced circuit arrangement and methods for linearizing and calibrating such a circuit arrangement wherein linearization is obtained by introducing a load imbalance between the output branches of the balanced circuit arrangement. Thus, a controllable extraneous imbalance is created between the output loads of the balanced circuit arrangement to thereby obtain a linearization by means of even-order non-linearity.

19 Claims, 5 Drawing Sheets

BALANCED CIRCUIT ARRANGEMENT AND METHOD FOR LINEARIZING SUCH AN ARRANGEMENT

FIELD OF THE INVENTION

The present invention relates to a balanced circuit arrangement such as a balanced or double-balanced amplifier or multiplier and to a method for linearizing such an arrangement e.g. in order to attenuate spurious signals and envelope distortions in radio receivers and transmitters.

BACKGROUND OF THE INVENTION

In radio reception, the linearity of the receiver is an essential requirement. The linearity performance of a receiver, in general, is usually dominated by the down-conversion mixer circuits. Such mixer circuits are used to translate or convert received high frequency signals down to a lower or intermediate frequency (IF). This conversion is achieved by mixing the received signals with a locally generated oscillator signal. By choosing the local oscillator signal to be a constant amount away from a selected or wanted signal in a first frequency band, the selected or wanted signal always appears at the same frequency in the intermediate frequency band. Thereby, selection of the selected or wanted signal may be facilitated by a fixed-tuned IF filter.

In homodyne or direct conversion receivers, the chosen intermediate frequency band is DC or zero frequency. The local oscillator then has a zero frequency separation from the selected or wanted signal. Any modulation on the selected or wanted signal that causes spectral components both above and below the nominal signal frequency becomes folded at the mixer output, as a component below the signal frequency or above the signal frequency will appear at the intermediate frequency above the nominal of zero. To allow for resolution of such folded components, two mixers are provided in a direct conversion receiver using local oscillator signals that are phase offset by 90 degrees. The components above and below the nominal signal frequency then appear folded as a sum signal at one mixer output and a difference signal at the other mixer output where they may be separated if desired. Such direct conversion receiver operations are described in more detail in document U.S. Pat. No. 5,241,702.

However, due to non-linearities, spurious responses will be generated in the direct conversion receiver, the worst being modulation-frequency interference at the receiver's mixer output caused by a strong amplitude-modulated signal of another transceiver. This will appear even if the frequency of the interfering signal considerably deviates from the receiving frequency. These interferences are mainly caused by the second-order distortion component which contains a variable-level DC component proportional to the amplitude of the interference-causing signal. The variable amplitude signal produces at the mixer output a signal which comprises a variable DC component and the frequency of which is identical with the variation of the amplitude. The spurious frequencies may corrupt the radio reception by blocking the following signal processing stages or deteriorating the detection of the desired signal which is overwhelmed by distortion.

The spurious frequencies can be categorized to exist due to the odd- and even-order non-linearities. The even-order mixing results are suppressed by using balanced or double-balanced mixer topologies. Ideally, the even-order spurious frequencies are cancelled in balanced and double-balanced constructions. However, in practice, the canceling is imperfect. The reason is the imperfect balance due to the mismatch of respective components in the differential branches, i.e. manufacturing tolerances.

In radio receivers utilizing a direct conversion architecture or a significantly low IF, the spurious signals cannot be removed by selecting an optimal IF. Due to the existence of the even-order distortions and imbalance in the circuitry, a variable DC component proportional to the signal level and amplitude modulation depth of the interfering signal occurs. Moreover, envelope distortions are detected, the amplitude of which is also proportional to the amplitude modulation depth of the interfering signal, and the frequency of which equals to the variation of the amplitude. Thus, not only a DC offset but also a low frequency disturbance may be generated to corrupt the desired reception band. This is a particular concern in down-conversion mixers of direct conversion receivers.

Several solutions for reducing distortions in radio receivers with low IF have been proposed. Document U.S. Pat. No. 5,749,051 suggests compensating unwanted terms caused by second-order intermodulation by feeding instantaneous power measurements to a signal processing unit along with the complex baseband signals. The signal processing unit then determines a complex compensation coefficient by correlating the power signal with the complex baseband signals. The complex compensation co-efficient is then employed to subtract a weighted amount of the power signal from the complex baseband signal in order to cancel the unwanted second-order intermodulation distortion terms. Furthermore, document EP 0 951 138 discloses a method for attenuating spurious signals in mixer circuits by setting variable-level bias voltages and/or currents to transistors in the mixer circuits. Additionally, document GB 2 346 777 suggests switching a DC offset correction in or out of the circuitry according to the received signal strength or signal-to-noise ratio.

Furthermore, the use of a dynamic matching procedure is described by E. Bautista et al., "Improved Mixer IIP2 through Dynamic Matching", in the Digest of ISSCC 2000, pp. 376-377. According to this procedure, any undesirable second-order intermodulation distortion product generated in the mixer circuit is modulated to a frequency where it can easily be filtered off. This can be achieved by applying a periodic signal to input switches of the mixer circuit in order to modulate the received input signal. If the periodic signal is replaced by a pseudo-random signal, the undesirable second-order intermodulation distortion products can be spread over a wide range of frequencies to achieve a desired second-order input intercept point (IIP2) performance.

The second-order distortion phenomena itself and its undesired products, i.e. DC offset and envelope distortions, have not been thoroughly investigated so far. Due to lack of proper analysis of this topic, most of the solutions have been focused on the removal of the DC offset. However, even if the DC offset at the output of the mixer circuit is reduced to zero, the circuit may still be in an imbalanced condition, due to the fact that the envelope distortion itself causes a DC term which is related to other DC offsets in a complex manner.

SUMMARY OF THE INVENTION

It is therefore an object of the present invention to provide a balanced circuit arrangement and method for linearizing such an arrangement, by means of which spurious signals and envelope distortions in radio receivers and transmitters can be reduced.

This object is achieved by a balanced circuit arrangement comprising: first transistor means coupled via first load means to a power source; second transistor means coupled via second load means to said power source; and linearity control means for linearizing the balanced circuit arrangement by adjusting the first and second load means into a load imbalance.

Furthermore, the above object is achieved by a method for linearizing a balanced circuit arrangement, comprising the steps of:

providing a controllable load means in at least one output branch of the balanced circuit arrangement; and adjusting the load of the controllable load means to obtain a linearizing load imbalance in the output branches of the balanced circuit arrangement.

Additionally, the above object is achieved by a method for calibrating a balanced circuit arrangement, comprising the steps of:

measuring a DC output level or a lowpass filtered signal level of said balanced circuit arrangement when no input signal is applied or when input signal changes have only a weak effect on the measured signal;

supplying a test signal to the input of said balanced circuit arrangement and measuring the DC output level;

determining a difference between said measured DC levels; and adjusting a load means in at least one output branch of said balanced circuit arrangement until said determined difference is minimized.

The input signal can be either connected or disconnected from the mixer input. In the former case, it should be assumed that the average level of the AM distortion in the input signal varies only a little during the calibration.

Accordingly, envelope distortions and even-order spurious signals are controlled by controlling or changing DC offset balance errors in the balanced circuit arrangement. The balance errors occur due to the mismatch of components, i.e. component manufacturing tolerances. Thereby, the balanced circuit arrangement can be linearized in terms of even-order non-linearity by introducing a controlled imbalance in the load of the balanced circuit arrangement. In particular, the invention can be applied to any balanced circuit arrangement in radio receivers and/or transmitters requiring even-order linearity, such as in mobile communications devices.

Thus, the second-order input intercept point (IIP2) can be maximized by adjusting the loads of balanced circuit arrangement into a slight imbalance. This can be achieved by creating a controllable extraneous imbalance between the output loads of the balanced circuit arrangement. According to the measurements and simulations, the IIP2 performance of the balanced circuit arrangement can be enhanced up to 30 dB. The imbalance in the DC voltage or lowpass filtered and averaged signal, generated between the output branches can then be cancelled at a later stage after the signals causing envelope or other distortions have been filtered out. The effect on other significant performance parameters is negligible due to the fact that the required artificial mismatch is relatively small compared to the absolute values of the load components.

According to an advantageous development, the linearity control means may be arranged to perform the adjustment by selectively switching load elements to at least one of the first and second load means. Preferably, the load elements may be weighted load elements. Thereby, the amount of load imbalance may easily be controlled by a switching control function based on corresponding control inputs. In case of a use of weighted load elements, a control based on binary control words can be implemented. Thus, the linearity control means may comprise at least one input terminal for inputting a control signal.

The balanced circuit arrangement may be a single- or double-balanced circuit arrangement. In general, the present invention is applicable to any mixer circuit comprising a balanced circuit arrangement, e.g. a Gilbert-cell multiplier. Furthermore, the present invention may be applied to any modulator and/or demodulator circuit, such as an IQ modulator and/or demodulator, or to any receiver and/or transmitter circuit comprising e.g. a direct conversion receiver, in which a balanced circuit arrangement can be used.

According to another advantageous development, the adjusting step may be performed by selectively switching load elements of the controllable load means.

Furthermore, the adjusting step of the calibrating method may be an iterative step and the difference may be monitored by an analog or by a digital signal processing routine.

BRIEF DESCRIPTION OF THE DRAWINGS

In the following, the present invention will be described in greater detail based on preferred embodiments with reference to the accompanying drawings, in which.

DESCRIPTION OF THE PREFERRED EMBODIMENT

The present invention will now be described on the basis of a single-balanced and double-balanced mixer circuit, as an examples for a balanced circuit arrangement according to the present invention, which may be used in a direct conversion receiver for WCDMA (Wideband Code Division Multiple Access) base station applications in 3rd generation mobile communication networks.

Figure 1:
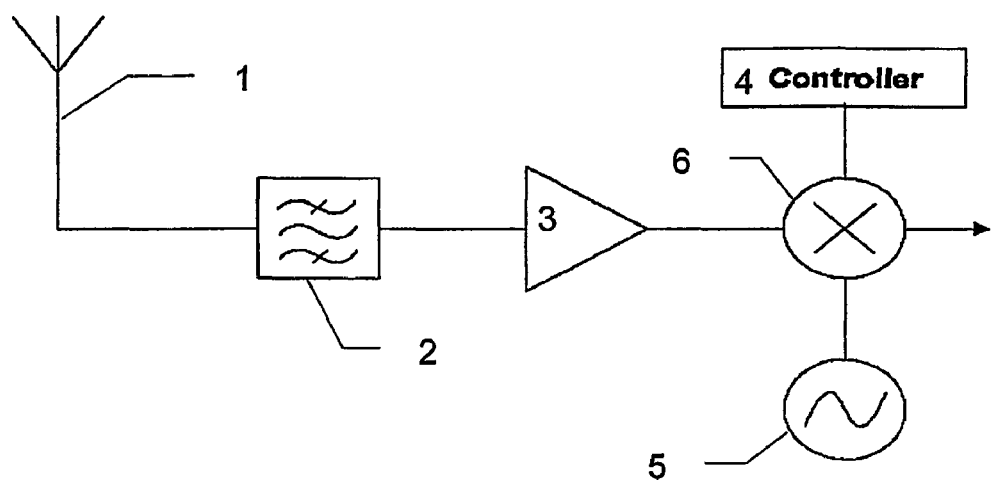
FIG. 1 shows a schematic block diagram of a receiver in which the present invention can be applied.

FIG. 1 shows a block diagram of those parts of the receiver which are essential to the present invention. The receiver comprises an antenna 1 from which a signal is received and filtered by a bandpass filter 2 and amplified by an amplifier 3. The amplified signal at the radio reception frequency is then mixed to the (zero) intermediate frequency in a balanced mixer 6 according to the preferred embodiments of the present invention. A local oscillator 5 feeds a predetermined frequency to the mixer 6, such that the radio reception frequency is mixed with the determined frequency of the local oscillator 5 to obtained the (zero) intermediate frequency. The linearity of the mixer 6 is controlled by a controller 4 by adjusting the load imbalance between the output branches of the mixer 6.

Figure 2:
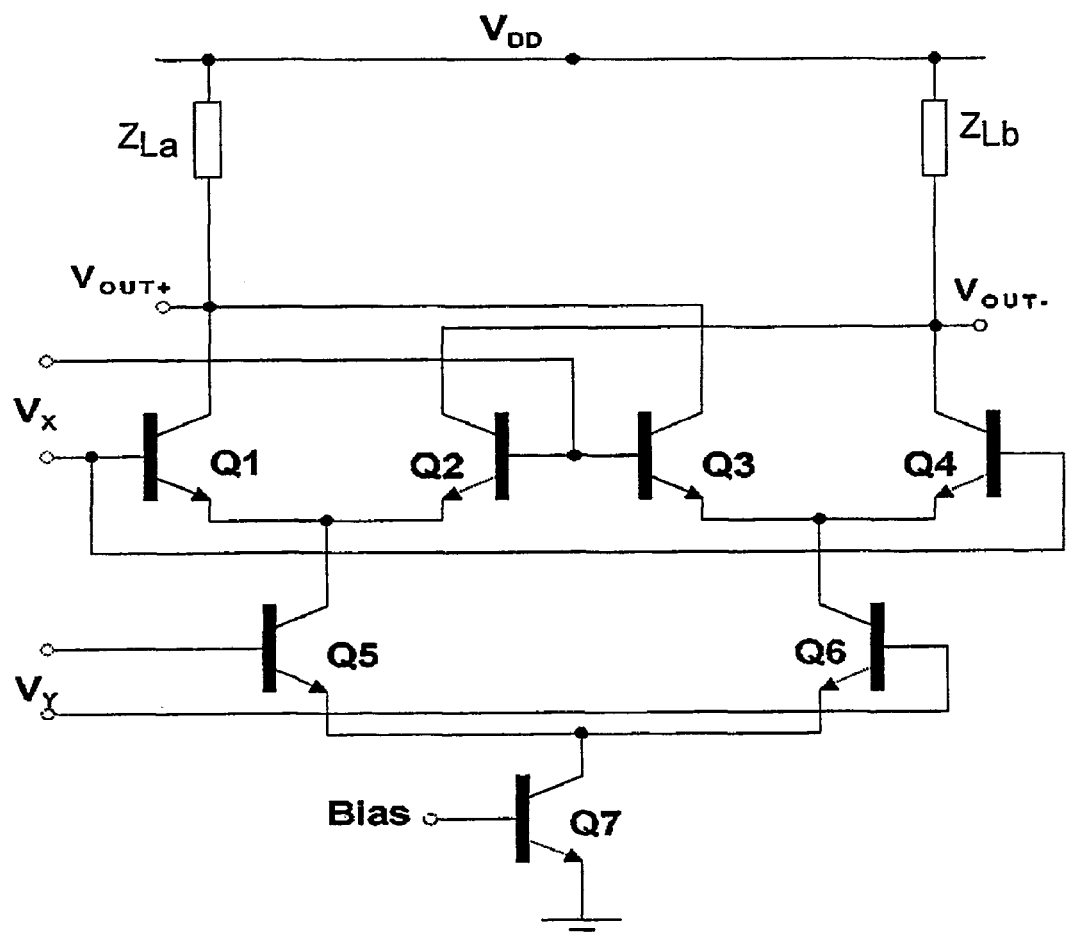
FIG. 2 shows a circuit diagram of a Gilbert-cell multiplier as an example for a balanced circuit arrangement in which the present invention can be applied.

FIG. 2 shows a known Gilbert-cell used as a balanced circuit arrangement in amplifiers, multipliers and mixers, such as the mixer 6 of FIG. 1. In the Gilbert-cell, two input voltages $V_X$ and $V_Y$ are multiplied into one output voltage $V_{OUT}$, i.e. the voltage difference at the outputs $V_{OUT+}$ and $V_{OUT-}$ corresponds to the product or multiplication of the input voltages. The first input voltage $V_X$ is applied between the base terminals of transistors Q1, Q2 and Q3, Q4, respectively. The second input voltage $V_Y$ is amplified by transistors Q5 and Q6. The transistors Q5 and Q6 are connected at their emitter terminals to a transistor Q7 which is controlled by a bias voltage and coupled to known potential. The output branches of the circuit are coupled to a positive operating voltage through load impedances $Z_{La}$ and $Z_{Lb}$. The transistors Q1 and Q4 amplify the first input voltage $V_X$ in a first polarity direction, and the transistors Q2 and Q3 amplify the first input voltage $V_X$ in a second polarity direction opposite to the first polarity direction. The amplified voltages are coupled and cross-coupled, respectively, to the outputs $V_{OUT+}$ and $V_{OUT-}$.

According to the present invention, the load values of the load impedances $Z_{La}$ and/or $Z_{Lb}$ are controlled by the controller 4 so as to introduced a load imbalance required to maximize the IIP2 performance of the multiplier or mixer circuit. It is noted that the load impedances $Z_{La}$ and $Z_{Lb}$ may be any load means or circuitry which provides a mechanism for adjusting the effective load value introduced into the respective output branch. Thereby, the IIP2 performance of the mixer circuit can be improved, since the DC and low-frequency effects of the envelope distortions can be compensated by the introduced load imbalance.

In general, any transceiver, receiver or transmitter circuit can be calibrated by properly adjusting the load imbalance of an included balanced circuit arrangement. A corresponding calibration method is described in the following.

Figure 3:
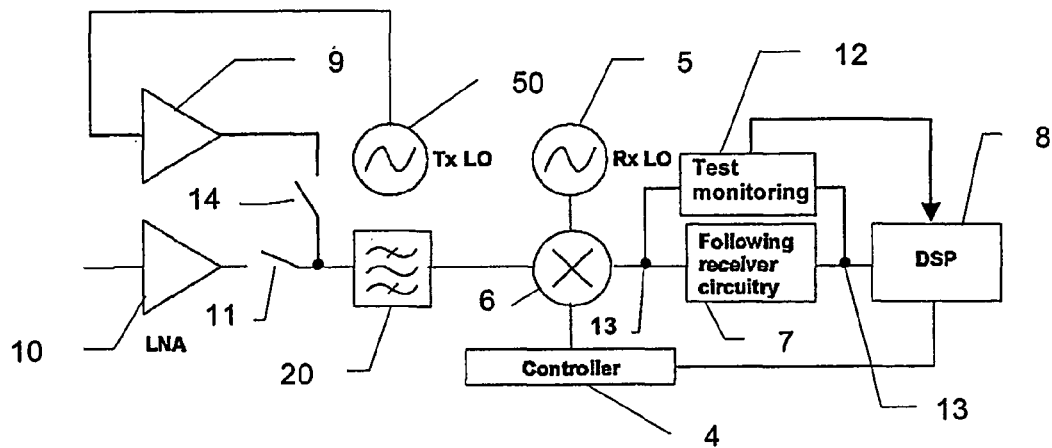
FIG. 3 shows a schematic block diagram of a calibration technique according to a preferred embodiment of the present invention.

FIG. 3 shows an arrangement by means of which the calibration technique can be implemented. In particular, FIG. 3 shows a direct conversion receiver arrangement comprising a low noise amplifier (LNA) 10 which is connected to an antenna (not shown) for receiving radio frequency signals. A received radio frequency signal is supplied to a bandpass filter 20 (optional) via a switching element or switch 11. The "bandpass" filter can be a simple ac-coupling device as well. Input signal can be also switched on and off by biasing of the preceding LNA 10, instead of switch 11. After the received signal has been filtered in the bandpass filter 20, it is supplied to the mixer 6, where it is mixed with a receiving local oscillator (Rx LO) 5 of a predetermined frequency related to the radio reception frequency. The signal converted to the IF or zero frequency is supplied to a following receiver circuitry 7, comprising a test monitoring circuitry 12, where the signal is detected at one of the test nodes 13 and distortions are extracted to obtain a measurement for the second-order non-linearity performance (i.e. IIP2 performance) of the receiving or mixer circuitry. A control signal corresponding to the IIP2 performance is supplied by the test monitoring circuitry 12 to a digital signal processor (DSP) 8 which evaluates the performance and supplies a corresponding control signal or control information to the controller 4 arranged to control the load imbalance in the output branches of the mixer 6. The procedure can be done independently in both inphase (I) and quadrature (Q) branches, e.g., in a direct conversion receiver. However, only one signal and one control path is drawn in FIG. 3.

To obtain a reference or test signal, a transmission local oscillator (Tx LO) 50 is connected via an amplifier circuit 9 and a second switching element 14 to the input of the mixer 6. Thus, either a received radio signal or the generated test signal or both can be switched to the bandpass filter 20. The test signal can be any locally or externally generated signal.

Figure 4:
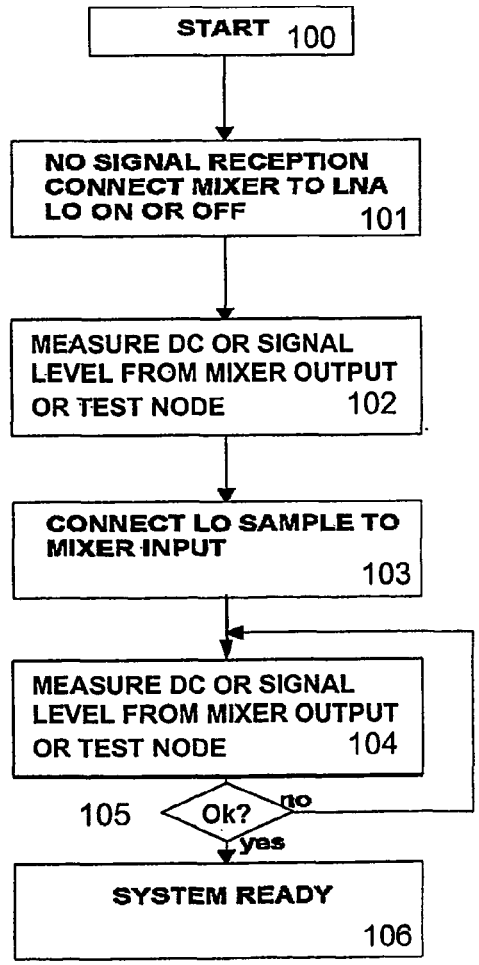
FIG. 4 shows a flow diagram of a calibration procedure according to the preferred embodiment of the present invention.

FIG. 4 shows a flow diagram of a calibration method according to a preferred embodiment. This calibration method is used to adjust or set the load values in the output branches of the mixer 6 by the controller 4 in order to obtain a maximum linearization of the mixer 6 by the means of even-order linearity. This calibration method can be used to calibrate the receiver circuit during a stand-by period or during relatively stable reception conditions, i.e. when input signal changes have only a weak effect on the measured signal.

After the start of the method in step S100, the switching element 11 is closed to connect the LNA 10 while no input signal is supplied to the mixer 6. In step S101, it may be considered or checked whether the receiving local oscillator 5 is switched on or off, since this may lead to different measuring results. Then, the output DC or lowpass filtered signal level of the mixer 6 is measured in step S102 by the test monitoring circuitry 12 at the respective one of the test nodes 13 and the measuring result is supplied to the DSP 8 where it may be stored. In step S103, the second switching element 14 is closed to connect to the output terminal of the amplifier circuit 9 so as to supply a sample of the test signal, e.g. the signal from the transmission local oscillator 50 in a receiver calibration, to the mixer 6, wherein the amplifier circuit 9 is arranged to provide an interface equivalent to that of the LNA 10. Alternatively, an attenuated test signal can be connected directly to the input of the LNA 10, while the second switching element 14 remains open or can be dispensed with. Due to the second-order non-linearity and imbalance in the mixer 6, a DC error voltage is generated at the output of the mixer 6. This DC error is proportional to the amplitude of the even-order spurious signal, and is measured and may be stored in the DSP 8.

Based on the measured DC outputs, the DSP 8 provides a control to the controller 4 so as to adjust the load imbalance and thereby minimize the increment or increase in the DC voltage or in the lowpass filtered output signal at the output of the mixer 6 due to the DC error. Thus, the receiver circuit can be linearized by this DC level set control. According to FIG. 4, the calibration process may be an iterative process and the DC error can be monitored by the routines of the DSP 8 e.g. via A/D converters (not shown). After each iteration, a check is performed in step 105 as to whether a satisfactory result has been achieved, i.e. whether the circuit has been linearized to a sufficient extent. If not, step 104 is repeated. When a satisfactory result is determined in step 105, the flow proceeds to step 106 where the user or a system is informed of the system ready state.

Thus, an automatically controlled calibration of receiver, transmitter or transceiver circuits can be provided.

Figure 5:
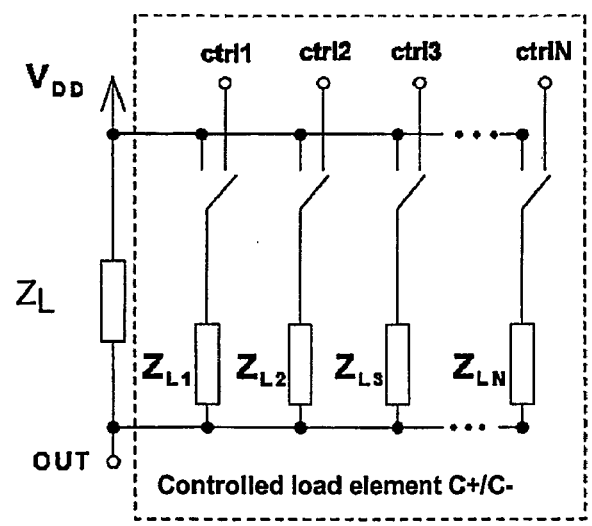
FIG. 5 shows a circuit diagram of a load controller which can be used in the preferred embodiment.

FIG. 5 shows a controllable adjustment block or circuitry for controlling the load value of the load elements $Z_{La}$. The same adjustment circuitry may be provided at the other load element $Z_{Lb}$. According to FIG. 5, the load adjustment or control arrangement comprises a plurality of load elements $Z_{L1}$ to $Z_{Ln}$ which can be switched to be connected in parallel to the load element $Z_{La}$ so as to decrease or increase the total load based on binary control signals provided to the control terminals ctrl1 to ctrlN. As an example, a logical signal "1" may be used to close the respective switch and to connect the respective load element in parallel to the load element $Z_{La}$. Thus, the load value generated by the load adjustment circuitry corresponds to the binary digits of the binary control word applied to the control terminals ctrl1 to ctrln.

The load elements $Z_{L1}$ to $Z_{Ln}$ may be arranged to provide weighted loads i.e. their load values may be generated by multiplying a basic load value with an integer number. As an example, the load value of an individual load element may be generated based on the following equation:

$$Z_{Li} = 2^{(i-1)} \cdot k \cdot Z_L$$

wherein $Z_L$ denotes a basic load value or unit load value, and k denotes an integer (1 ... n) selected according to the desired tuning range. Due to the fact that the above equation corresponds to the weighting of a dual number system, a direct relation between the binary control word applied to the control terminals ctrl1 to ctrlN and the generated load value can be obtained, while the control terminal ctrl1 corresponds to the most significant bit (MSB) and the control terminal ctrlN corresponds to the least significant bit (LSB). The adjustment circuitry comprises weighted fingers of load elements connected in parallel to a basic or original load. Each finger can be selected using the respective switch. Thus, in case resistor loads are used, the control terminal ctrlN connects the largest parallel resistor finger in parallel to the basic load $Z_L$ to thereby obtain a minimum load change. The resolution of the load adjustment control can be selected to achieve a desirable range, e.g. the resolution may be 0.1%. As determined on the basis of simulations and measurements, the total tuning range should preferably cover a range of ±5% of the basic or original load value.

In complex receiver, transmitter or transceiver arrangements, each mixer, modulator or other balanced circuit arrangement can be adjusted separately. The calibration sequence may include counting of digital codes for adjusting the load imbalance, wherein measurements are swapped until the accepted level is reached.

Figure 6:
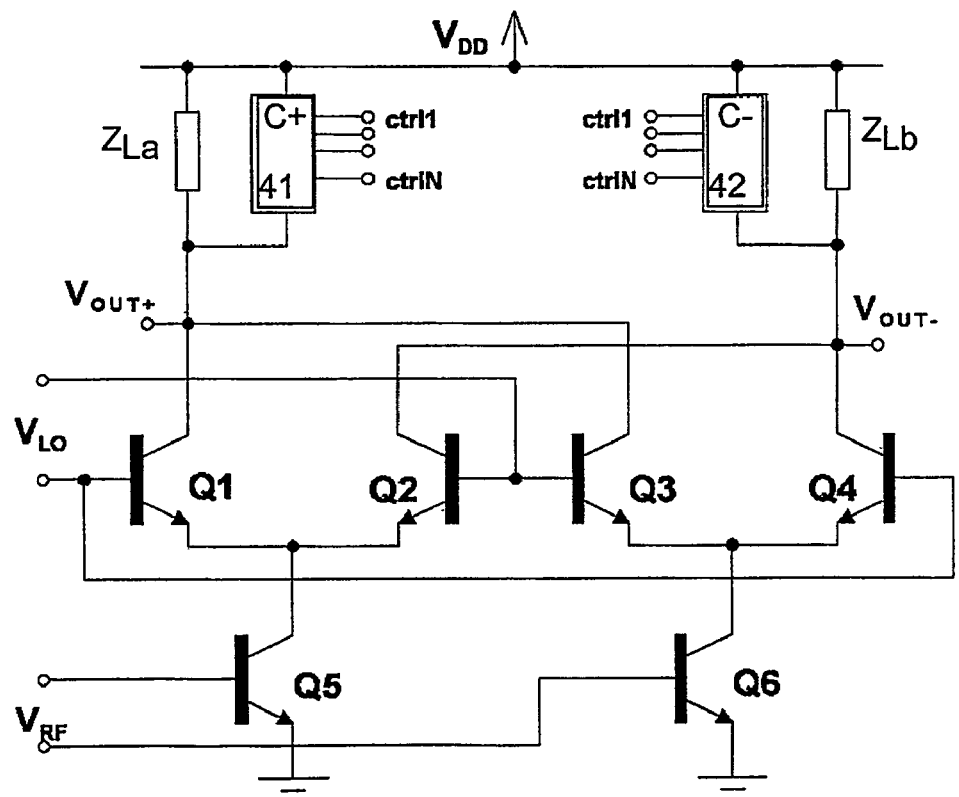
FIG. 6 shows a double-balanced mixer as a preferred embodiment of a doublebalanced circuit arrangement.

FIG. 6 shows a double-balanced multiplier mixer circuit similar to the Gilbert-cell shown in FIG. 2, wherein the bias adjusting transistor Q7 has been removed. Nevertheless, the circuitry of FIG. 6 may as well include the bias adjusting transistor Q7.

According to the embodiment of FIG. 6, both loads $Z_{La}$ and $Z_{Lb}$ can be adjusted by respective load adjustment circuits C+ 41 and C− 42 respectively, connected in parallel to the respective load in the respective output branch. Thus, an individual or branch-selective load adjustment can be performed by the controller 4. Both load adjustment circuits 41 and 42 may be arranged as shown in FIG. 5.

As can be gathered from FIG. 6, a local oscillator voltage $V_{LO}$ generated by the receiving local oscillator 5 is applied between the base terminals of the transistors Q1 and Q2 and between the base terminals of transistors Q3 and Q4, while a radio reception frequency voltage $V_{RF}$ obtained from the LNA 10 is supplied between the base terminals of the transistors Q5 and Q6. Thereby, the output voltage $V_{OUT}$ between the collector terminals of the transistors Q1 and Q3 and the transistors Q2 and Q4 corresponds to a multiplication of the local oscillator voltage $V_{LO}$ and the radio reception frequency voltage $V_{RF}$. The load value can be trimmed in both output branches to obtain a desired load imbalance.

Figure 7:
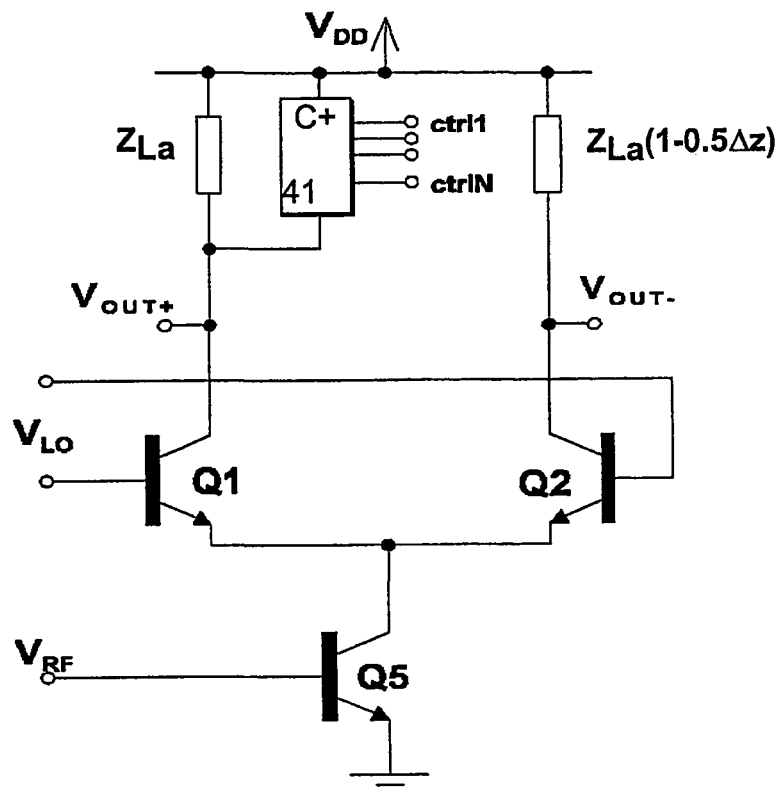
FIG. 7 shows a circuit diagram of a single-balanced mixer as a preferred embodiment of a single-balanced circuit arrangement.

FIG. 7 shows an embodiment of a single-balanced mixer or multiplier circuit, where the load of only one output branch can be adjusted by the controller 4. In particular, a load adjustment or control circuit C+ 41 is connected in parallel to the load $Z_{La}$ of one output branch. Thus, load trimming is performed in one output branch. In this case, the load value of the other load $Z_{Lb}$ should be selected according to the following equation:

$$Z_{Lb} = Z_{La} \cdot (1 - 0.5 \, \Delta z),$$

wherein $\Delta z$ indicates the tuning range of the load adjustment circuit 41 in percentages relative to the actual load. Thereby, an adjustment of the load imbalance is possible by the same amount in both directions.

Figure 8:
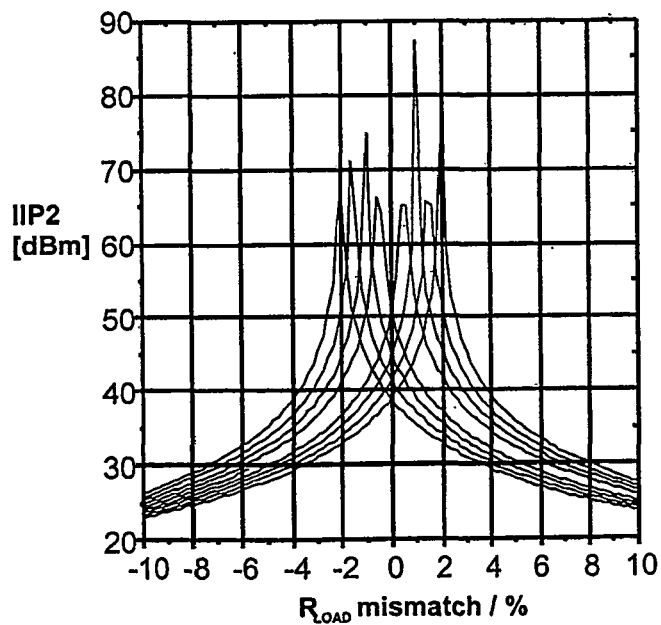
FIG. 8 shows simulated IIP2 performance characteristics for different fixed imbalances between the output branches.

It is noted that both single-balanced and double-balanced mixers can be linearized by trimming in either both output branches or one of the branches FIG. 8 shows characteristics of a simulated IIP2 performance of a mixer circuit versus the mismatch in the load values or resistances, achieved by the load adjustment circuits 41 and/or 42. The different characteristics have been obtained for different fixed imbalances in the mixer circuit. The behavior is similar and repeatable for both single-balanced and double-balanced mixer circuits or other balanced circuit arrangements. As can be gathered from FIG. 8, depending on the initial fixed imbalances, which may be the result of component mismatches, the performance peaks of the IIP2 performance are located at different percentual load mismatch values. Thus, if the corresponding load mismatch value is introduced into the mixer circuit, an optimized IIP2 performance can be achieved.

Figure 9:
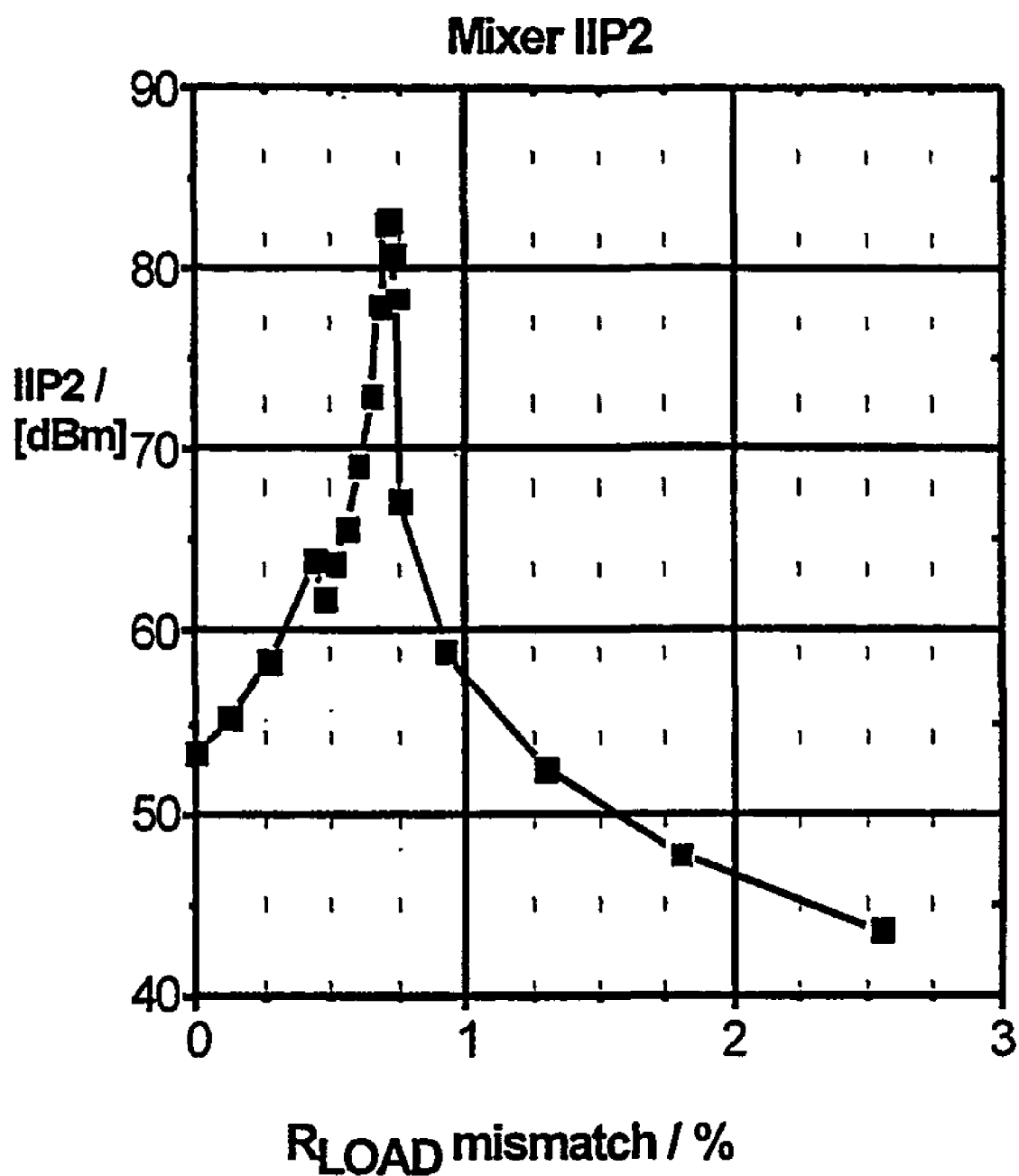
FIG. 9 shows a measured trimming performance of an implemented integrated direct conversion receiver.

FIG. 9 shows a measured trimming performance of an implemented integrated direct conversion receiver. According to FIG. 9, the measuring results correspond to the simulated characteristics shown in FIG. 8. In particular, a sharp peak in the IIP2 performance of the direct conversion receiver is obtained at a load mismatch of approximately 0.7%. Thus, the iterative calibration procedure will lead to a load adjustment to achieve this optimal load mismatch.

It is noted that the present invention is not restricted to the concrete circuit arrangements described in the preferred embodiments. The load adjustment may be performed by any control means or elements which are suitable to change or control load values in at least one of the respective output branches. In particular, the load adjustment may be realized by active elements such as bipolar or unipolar transistors, diodes or other semiconductor elements. Furthermore, the balanced circuit arrangement may be provided in IQ modulators, multi-carrier or multi-frequency receiver and/or transmitter systems. Furthermore, the calibration signals used for adjusting the load adjustment circuit can be obtained by using modulated carriers to allow for a greater flexibility of calibration. The measuring of the DC level or the lowpass filtered test signal may be performed solely by the DSP 8, such that the test monitoring circuitry 12 can be dispensed with. The above preferred embodiments may thus vary within the scope of the attached claims.

The invention claimed is:

1. A balanced circuit arrangement comprising:
   a) first transistor means coupled via first load means to a power source;
   b) second transistor means coupled via second load means to said power source; and c) linearity control means for linearizing said balanced circuit arrangement by adjusting said first and second load means into a load imbalance.

2. A circuit arrangement according to claim 1, wherein said linearity control means are arranged to perform said adjustment by selectively switching load elements to at least one of said first and second load means.

3. A circuit arrangement according to claim 2, wherein said load elements are weighted load elements.

4. A circuit arrangement according to claim 1, wherein said linearity control mean comprise at least one input terminal for inputting a control signal.

5. A circuit arrangement according to claim 1, wherein said balanced circuit arrangement is a double-balanced circuit arrangement.

6. A mixer circuit comprising a balanced circuit arrangement as claimed in claim 1.

7. A mixer circuit according to claim 6, wherein said mixer circuit is a Gilbert-cell multiplier.

8. A modulator and/or demodulator circuit comprising a balanced circuit arrangement as claimed in claim 1.

9. A modulator and/or demodulator circuit according to claim 8, wherein said modulator and/or demodulator circuit is an IQ modulator and/or demodulator.

10. A receiver and/or transmitter circuit comprising a balanced circuit arrangement as claimed in claim 1.

11. A receiver and/or transmitter circuit according to claim 10, wherein said receiver and/or transmitter circuit comprises a direct conversion receiver.

12. A method for linearizing a balanced circuit arrangement, comprising the steps of:
a) providing a controllable load means in at least one output branch of said balanced circuit arrangement; and
b) adjusting the load of said controllable load means to obtain a linearizing load imbalance in the output branches of said balanced circuit arrangement.

13. A method according to claim 12, further comprising the step of canceling a DC voltage or lowpass filtered and averaged signal imbalance between said output branches after other distortion signals have been filtered out.

14. A method according to claim 12, wherein said adjustment step is performed by selectively switching load elements of said controllable load means.

15. A method according to claim 14, further comprising the step of providing said load elements with weighted load values.

16. A method for calibrating a balanced circuit arrangement, comprising the steps of:
a) measuring a DC output level or lowpass filtered level of said balanced circuit arrangement when no input signal is applied or when input signal changes have only a weak effect on the measured signal;
b) supplying a test signal to the input of said balanced circuit arrangement and measuring the DC output level;
c) determining a difference between said measured DC levels; and
d) adjusting a load means in at least one output branch of said balanced circuit arrangement until said determined difference is minimized.

17. A method according to claim 16, wherein said adjusting step is an iterative step and said difference is monitored by a digital signal processing routine.

18. A method according to claim 16, wherein said adjusting step is performed by selectively switching load elements of said load means.

19. A method according to claim 16, wherein said calibrating method is used to calibrate a mixer circuit or modulator of a direct conversion receiver.

* * * * *